United States Patent [19]
Chen

[11] Patent Number: 5,913,137
[45] Date of Patent: Jun. 15, 1999

[54] PROCESS ESD PROTECTION DEVICES FOR USE WITH ANTIFUSES

[75] Inventor: Wenn-Jei Chen, Sunnyvale, Calif.

[73] Assignee: Actel Corporation, Sunnyvale, Calif.

[21] Appl. No.: 08/725,333

[22] Filed: Oct. 1, 1996

Related U.S. Application Data

[62] Division of application No. 08/425,094, Apr. 18, 1995, Pat. No. 5,629,227, which is a division of application No. 08/290,029, Aug. 12, 1994, Pat. No. 5,498,895, which is a continuation-in-part of application No. 08/277,673, Jul. 19, 1994, Pat. No. 5,519,248, which is a continuation of application No. 08/087,942, Jul. 7, 1993, Pat. No. 5,369,054.

[51] Int. Cl.⁶ .................................................. H01L 21/44
[52] U.S. Cl. ......................... 438/600; 438/131; 438/467; 257/50; 257/530
[58] Field of Search .................................. 438/131, 467, 438/600; 257/50, 530

[56] References Cited

U.S. PATENT DOCUMENTS

| | | | |
|---|---|---|---|
| 3,634,929 | 1/1972 | Yoshida et al. | 29/577 |
| 3,787,822 | 1/1974 | Rioult | 340/173 SP |

(List continued on next page.)

FOREIGN PATENT DOCUMENTS

| | | | |
|---|---|---|---|
| 0 387 887 | 3/1990 | European Pat. Off. | H01L 23/525 |
| 0 414 361 | 7/1990 | European Pat. Off. | H01L 23/52 |
| 0 416 903 | 9/1990 | European Pat. Off. | H01L 21/3205 |
| 0 452 091 | 4/1991 | European Pat. Off. | H01L 23/525 |
| 0 455 414 | 4/1991 | European Pat. Off. | H01L 23/525 |
| 0 501 120 | 1/1992 | European Pat. Off. | H01L 23/525 |
| 0 500 034 | 2/1992 | European Pat. Off. | H01L 23/525 |
| 0 528 417 | 8/1992 | European Pat. Off. | G11C 17/16 |
| 0 539 197 | 10/1992 | European Pat. Off. | H01L 23/525 |
| 0 750 343 | 12/1996 | European Pat. Off. | H01L 23/525 |
| 2 367 352 | 10/1977 | France . | |
| 5-135684 | 6/1993 | Japan | H01H 85/045 |
| 2 222 024 | 2/1990 | United Kingdom | H01L 21/82 |
| WO 93/03499 | 2/1993 | WIPO | H01L 23/525 |
| WO 93/04499 | 3/1993 | WIPO . | |
| WO 93/08602 | 4/1993 | WIPO | H01L 23/60 |
| WO 93/05514 | 8/1993 | WIPO | H01L 29/68 |

OTHER PUBLICATIONS

Chen, et al., "A Sublithographic Antifuse Structure for Field–Programmable Gate Array Applications," IEEE Electronic Device Letters, vol. 13, No. 1, pp. 53–55, 1992.

Gordon, et al., "Conducting Filament of the Programmed Metal Electrode Amorphous Silicon Antifuse," IEEE 1993, pp. 27–30.

Rountree, Robert, "ESD Protection for Submicron CMOS Circuits: Issues and Solutions," Proceedings of the Electron Devices Meeting (Dec. 11–14, 1988) San Francisco, CA.

Primary Examiner—John Niebling
Assistant Examiner—Lynne A. Gurley
Attorney, Agent, or Firm—D'Alessandro & Ritchie

[57] ABSTRACT

A process electrostatic discharge ("ESD") protection device is incorporated on a chip with the antifuses that it is designed to protect and is formed as close in time as possible to the deposition of the antifuse material layer (the layer being protected) so that ESD protection is available at all practical stages of processing. According to a first aspect of the invention, an ESD protection device is formed by exposing edges of an antifuse bottom electrode during the antifuse cell open mask/etch step. It is biased on during processing. A sharp corner of the electrode and a deep aspect ratio provide degrade antifuse performance for the protection cell (resulting in reduced breakdown voltage and increased leakage current) and, as designed, the protection cell will rupture before other cells because it has a lower breakdown voltage. Once the protection cell ruptures, it will continue to conduct and protect other antifuses from ESD damage. When processing is complete, the protection cell is biased off and has no effect on the remaining antifuses. According to a second aspect of the present invention, a deep valley topography is created under a bottom electrode of the protection cell. Because the cell is deeper than the other antifuse cells while retaining the same cell opening size, the step coverage within the protection cell will be reduced and the protection cell will have a lower breakdown voltage than the regular antifuse cells formed with it. In all other respects, it operates as set forth regarding the first aspect of the invention.

2 Claims, 2 Drawing Sheets

U.S. PATENT DOCUMENTS

| | | | |
|---|---|---|---|
| 4,072,976 | 2/1978 | Harari | 357/23 |
| 4,420,820 | 12/1983 | Preedy | 365/105 |
| 4,599,705 | 7/1986 | Holmberg et al. | 365/163 |
| 4,651,409 | 3/1987 | Ellsworth et al. | 29/576 |
| 4,748,490 | 5/1988 | Hollingsworth | 357/51 |
| 4,751,197 | 6/1988 | Wills | 437/174 |
| 4,786,956 | 11/1988 | Puar | 357/23.13 |
| 4,796,075 | 1/1989 | Whitten | 357/51 |
| 4,821,096 | 4/1989 | Maloney | 357/23.13 |
| 4,822,753 | 4/1989 | Pintchovski et al. | 437/192 |
| 4,823,181 | 4/1989 | Mohsen et al. | 357/51 |
| 4,829,350 | 5/1989 | Miller | 357/23.13 |
| 4,847,732 | 7/1989 | Stopper et al. | 361/395 |
| 4,851,364 | 7/1989 | Yatsuda et al. | 437/42 |
| 4,862,243 | 8/1989 | Welch et al. | 357/51 |
| 4,866,001 | 9/1989 | Pickett et al. | 437/32 |
| 4,868,138 | 9/1989 | Chan et al. | 437/44 |
| 4,870,302 | 9/1989 | Freeman | 307/465 |
| 4,899,205 | 2/1990 | Hamdy et al. | 357/51 |
| 4,912,066 | 3/1990 | Wills | 437/173 |
| 4,914,055 | 4/1990 | Gordon | 437/192 |
| 4,933,576 | 6/1990 | Tamamura et al. | 307/465 |
| 4,941,028 | 7/1990 | Chen et al. | 357/23.13 |
| 4,943,538 | 7/1990 | Mohsen et al. | 437/52 |
| 5,070,384 | 12/1991 | McCollum et al. | 357/51 |
| 5,100,827 | 3/1992 | Lytle | 437/52 |
| 5,111,262 | 5/1992 | Chen et al. | 357/23.13 |
| 5,120,679 | 6/1992 | Boardman et al. | 437/195 |
| 5,134,457 | 7/1992 | Hamdy et al. | 357/51 |
| 5,163,180 | 11/1992 | Eltoukhy et al. | 257/530 |
| 5,166,556 | 11/1992 | Hsu et al. | 307/465 |
| 5,171,715 | 12/1992 | Husher et al. | 437/195 |
| 5,191,550 | 3/1993 | Kubota | 365/96 |
| 5,196,724 | 3/1993 | Gordon et al. | 257/530 |
| 5,208,177 | 5/1993 | Lee | 437/47 |
| 5,233,206 | 8/1993 | Lee et al. | 257/50 |
| 5,233,217 | 8/1993 | Dixit et al. | 257/530 |
| 5,248,632 | 9/1993 | Tung et al. | 437/195 |
| 5,266,829 | 11/1993 | Hamdy et al. | 257/530 |
| 5,290,734 | 3/1994 | Boardman et al. | 437/195 |
| 5,300,456 | 4/1994 | Tigelaar et al. | 437/195 |
| 5,322,812 | 6/1994 | Dixit et al. | 437/60 |
| 5,329,153 | 7/1994 | Dixit | 257/530 |
| 5,341,267 | 8/1994 | Whitten et al. | 361/56 |
| 5,353,246 | 10/1994 | Tsang et al. | 365/96 |
| 5,477,414 | 12/1995 | Li et al. | 361/56 |
| 5,498,895 | 3/1996 | Chen | 257/355 |
| 5,527,745 | 6/1996 | Dixit et al. | 438/600 |
| 5,571,741 | 11/1996 | Leedy | 437/51 |
| 5,610,790 | 3/1997 | Staab et al. | 361/56 |
| 5,623,387 | 4/1997 | Li et al. | 361/56 |
| 5,656,534 | 8/1997 | Chen et al. | 438/600 |
| 5,661,056 | 8/1997 | Takeuchi | 438/261 |
| 5,689,133 | 11/1997 | Li et al. | 257/361 |
| 5,693,556 | 12/1997 | Cleeves | 437/60 |
| 5,763,898 | 6/1998 | Forouhi et al. | 257/50 |

PROCESS ESD PROTECTION DEVICES FOR USE WITH ANTIFUSES

CROSS-REFERENCE TO RELATED APPLICATION

This application is a divisional of U.S. patent application Ser. No. 08/425,094 filed Apr. 18, 1995 now U.S. Pat. No. 5,629,227 in the name of inventor Wenn-Jei Chen and entitled "Process ESD Protection Devices for Use with Antifuses", which is, in turn, a divisional of U.S. patent application Ser. No. 08/290,029 filed Aug. 12, 1994 now U.S. Pat. No. 5,498,895 in the name of inventor Wenn-Jei Chen and entitled "Process ESD Protection Devices for Use with Antifuses", which is, in turn, a continuation-in-part of U.S. patent application Ser. No. 08/277,673 filed Jul. 19, 1994, now U.S. Pat. No. 5,519,248 in the names of inventors Yeouchung Yen, Wenn-Jei Chen, Steve S. Chiang and Abdul R. Forouhi and entitled "Circuits for ESD Protection of Metal-to-Metal Antifuses During Processing" and assigned to Actel Corporation which is a continuation of U.S. patent application Ser. No. 08/087,942 filed Jul. 7, 1993 in the name of inventors Yeouchung Yen, Wenn-Jei Chen, Steve S. Chiang and Abdul R. Forouhi and entitled "Circuits for ESD Protection of Metal-to-Metal Antifuses During Processing", now U.S. Pat. No. 5,369,054.

BACKGROUND OF THE INVENTION

1. Field of the Invention

The present invention is directed to a process ESD protection device for use during processing with structures containing antifuses. According to this invention, an ESD protection device is formed as close in time as possible to the formation of the antifuse material layer so that the antifuse devices can be protected from ESD occurring during processing.

2. The Prior Art

Metal-to-metal, metal-to-poly (polysilicon), and poly-to-poly antifuses have become increasingly important in one-time user programmable memory and logic devices. However, making metal-to-metal antifuses in high volume production has not been achieved due to various manufacturability concerns. During the fabrication process used for manufacturing antifuse elements, the wafer is exposed to environments which are potentially harmful to the antifuse material positioned between the lower and upper antifuse electrodes. For example, reactive ion plasma etching techniques employed to define small geometry features can result in the accumulation of large static charges giving rise to high voltages across sensitive areas in the integrated circuit being fabricated.

Antifuse materials which are engineered to rupture at predictable (and often relatively low) voltages are very sensitive to this phenomenon. The static charge buildup occurring during processing can easily damage the antifuse device and alter its electrical characteristics without any predictability. The resulting damaged antifuse device will therefore have unpredictable characteristics both with respect to breakdown voltage and with respect to long term stability in either the "on" (conducting) or "off" (non-conducting) states.

OBJECTS AND ADVANTAGES OF THE INVENTION

Accordingly, it is an object of the present invention to provide an ESD protection device useful for protecting a number of antifuses from static discharge damage during the manufacturing process.

It is a further object of the present invention to provide a number of different mechanisms which may be used singly or in combination to provide an ESD protection device useful for protecting a number of antifuses from static discharge damage during the manufacturing process.

Yet a further object of the present invention is to provide an ESD protection device similar in operation to an antifuse and adapted to be fabricated simultaneously with the antifuses that it is designed to protect, but which has a lower breakdown voltage and higher leakage current than those antifuses that it is designed to protect.

These and many other objects and advantages of the present invention will become apparent to those of ordinary skill in the art from a consideration of the drawings and ensuing description of the invention.

SUMMARY OF THE INVENTION

The present invention is directed to providing a process electrostatic discharge ("ESD") protection device incorporated on an integrated circuit chip with the antifuses that it is designed to protect which is formed as close in time as possible to the deposition of the antifuse material layer (the layer being protected) so that ESD protection is available at all practical stages of processing.

According to a first aspect of the invention, an ESD protection device is formed by exposing edges of an antifuse bottom electrode during the antifuse cell open mask/etch step. It is biased on during processing. A sharp corner of the electrode and a deep aspect ratio provide degraded antifuse performance for the protection cell (resulting in reduced breakdown voltage and increased leakage current) and, as designed, the protection cell will rupture before other cells because it has a lower breakdown voltage. Once the protection cell ruptures, it will continue to conduct and protect other antifuses from ESD damage. When processing is complete, the protection cell is biased off and has no effect on the remaining antifuses.

According to a second aspect of the present invention, a deep valley topography is created under a bottom electrode of the protection cell. Because the cell is deeper than the other antifuse cells while retaining the same cell opening size, the step coverage within the protection cell will be reduced and the protection cell will have a lower breakdown voltage than the regular antifuse cells formed with it. In all other respects, it operates as set forth regarding the first aspect of the invention.

DESCRIPTION OF THE PREFERRED EMBODIMENTS

Those of ordinary skill in the art will realize that the following description of the present invention is illustrative only and is not intended to be in any way limiting. Other embodiments of the invention will readily suggest themselves to such skilled persons from an examination of the within disclosure.

Integrated circuit device fabrication processes tend to expose the devices on the wafer under fabrication to various electrostaticly induced voltages. Antifuses formed on such wafers are particularly susceptible to electrostatic discharge ("ESD") damage as they are designed to be programmed by relatively low voltages (typically in the range of about 6 to 100 volts). Since the failure of a single antifuse can result in the rejection of an entire device containing hundreds or thousands of antifuses, it is important to provide some sort of protection to minimize ESD damage during fabrication of these devices.

Figure 1:
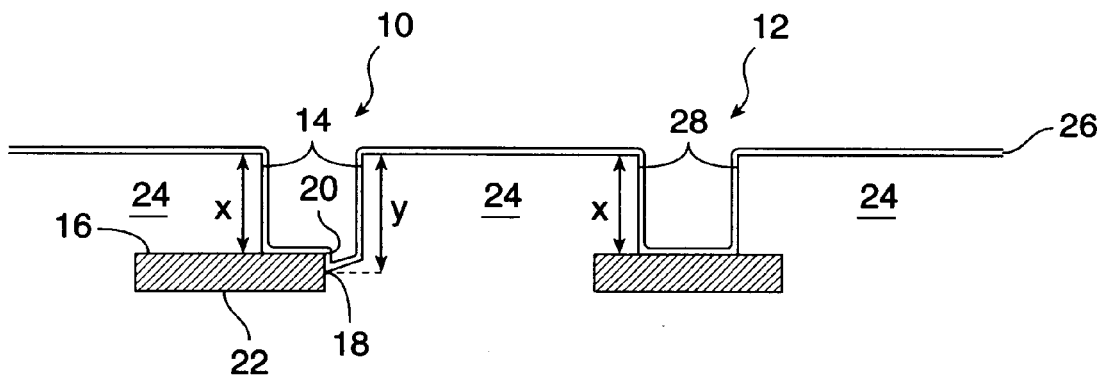
FIG. 1 is a diagram showing an ESD protection device for use with antifuses according to a first aspect of the present invention.
Figure 2:
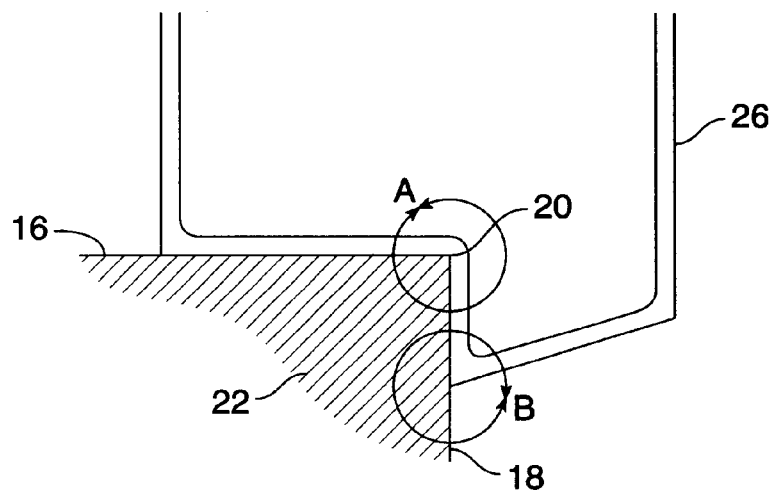
FIG. 2 is an enlargement of a portion of FIG. 1.

Turning to FIG. 1, according to a first preferred embodiment of the present invention, a protection cell 10 is provided to protect a number of simultaneously fabricated antifuse cells 12. One of these is shown in FIG. 1. The cell opening 14 for protection cell 10 exposes the upper surface 16, side surface 18 and corner 20 of bottom electrode 22. As can be seen, interlayer dielectric layer 24 has a thickness of "x" over bottom electrode 22 and a thickness of "y" where y>x to the right of the side surface 18 of bottom electrode 22. This causes two types of effects which tend to reduce the breakdown voltage and increase the leakage current of protection cell 10 versus standard antifuse cell 12. First, the corner (shown enlarged at "A" in FIG. 2) provides a difficult target to cover with antifuse material layer 26, accordingly, step coverage is reduced and the antifuse material layer 26 is thinner at the corner A; similarly, the sharp angle shown at "B" in FIG. 2 presents another difficult target to cover, and, as a result, the antifuse material thickness at B can be expected to be less than that of the antifuse material thickness in antifuse cell 12 which lacks these tortuous features. Second, the difference in vertical height y vs x means that a fixed amount of antifuse material layer deposited into cell opening 14 will have to cover more area than the same amount of antifuse material deposited into cell opening 28 of standard antifuse cell 12. (Note that the areal size or top cross-sectional area of cell opening 14 is the same as that of cell opening 28.) This will result in at least some spots in protection cell 10 being thinner than their corresponding spots in antifuse cell 12. Accordingly, protection cell 10 will break down first in the presence of sufficient ESD voltage resulting in the formation of a conductive link through the antifuse material layer of the protection cell. This will prevent future ESD voltages from damaging standard antifuse 12 as a current path will exist to discharge any such ESD voltage.

As known to those of ordinary skill in the art, the lower electrode 22 may be biased on during processing of the integrated circuit device and, in the absence of a bias current voltage after processing, will remain biased off after processing so that the existence of a conductive link in the protection cell antifuse processing so that the existence of a conductive link in the protection cell antifuse material layer will not affect operation of the standard antifuse cells 12.

Figure 3:
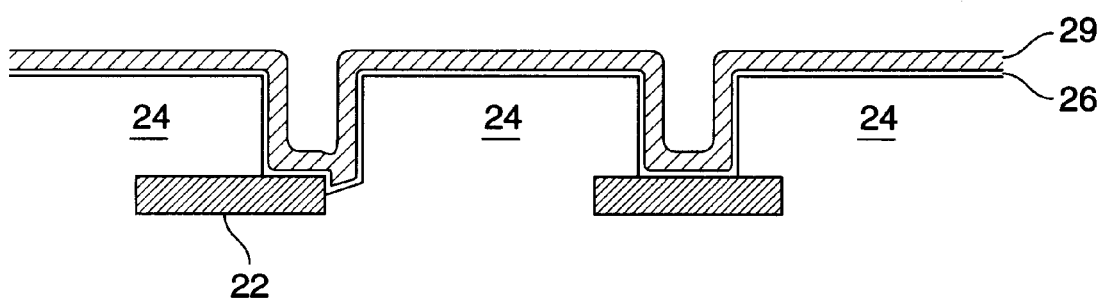
FIG. 3 is a diagram showing an ESD protection device for use with antifuses according to a first aspect of the present invention.

As shown in FIG. 3. an upper metal interconnect layer 29 together with appropriate barrier material layers where necessary may be deposited over antifuse material layer 26 as known to those of ordinary skill in the art.

Figure 4:
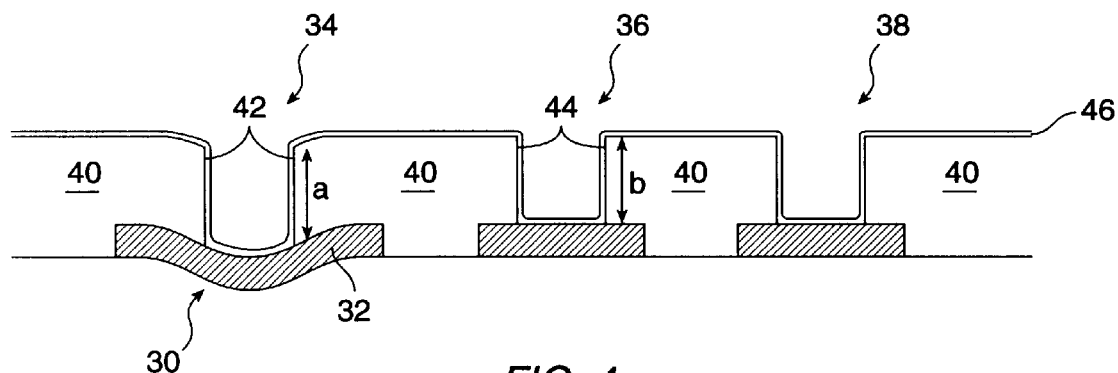
FIG. 4 is a diagram showing an ESD protection device for use with antifuses according to a second aspect of the present invention.

Turning now to FIG. 4, according to a second preferred embodiment of the present invention, a deep valley topology 30 is created under the bottom electrode 32 of protection cell 34 for the protection of standard antifuses 36, 38. By creating a deep valley as shown, the thickness "a" of the interlayer dielectric layer 40 in the vicinity of the protection cell 34 is thicker than the thickness "b" of the interlayer dielectric layer in the vicinity of standard antifuse cells 36, 38. As a result, given that, as before, the size of the cell opening 42 of the protection cell 34 is the same as the size of the cell opening 44 of the standard antifuse 36, the thickness of the antifuse material layer 46 in cell opening 42 of protection cell 34 will be less than the thickness of that layer in cell opening 44 of standard antifuse 36. As a result, protection cell 34 will rupture in the presence of lower voltages than will antifuse cell 36 and it will provide higher leakage currents due to its thinner antifuse material layer.

Figure 5:
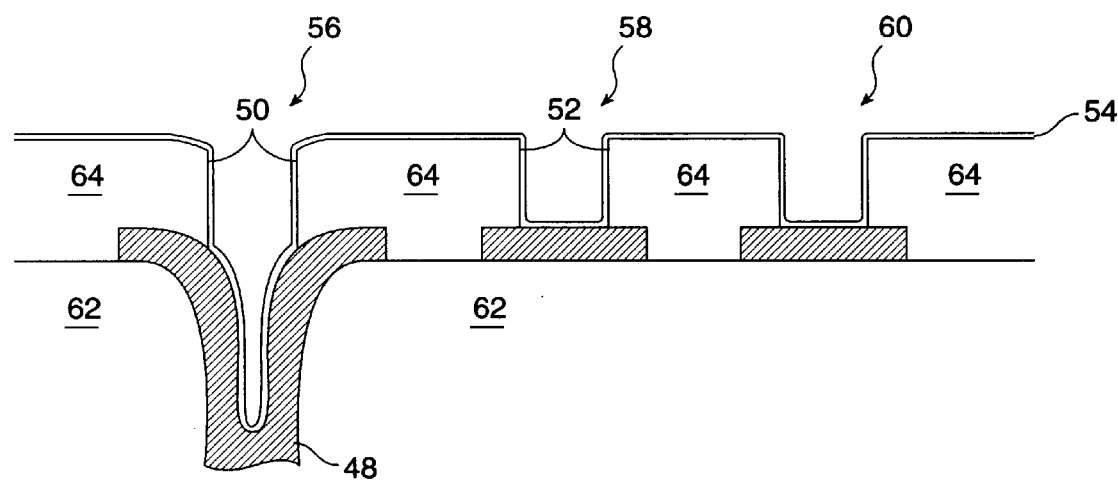
FIG. 5 is a diagram showing an ESD protection device for use with antifuses according to a third aspect of the present invention.

FIG. 5 depicts yet another embodiment of the present invention very similar to the embodiment shown in FIG. 4. In the FIG. 5 embodiment, however, the deep valley topology is replaced with a cell opening or contact opening 48 in a first interlayer dielectric layer 62, however, the effects are the same as stated in regard to FIG. 4, i.e., the effective depth of the cell opening 50 through second interlayer dielectric layer 64 being greater than the effective depth of the standard antifuse cell opening 52 causes antifuse material layer 54 to be thinner in the region of protection cell 56 than it is in the region of standard antifuse cells 58, 60.

While illustrative embodiments and applications of this invention have many more modifications than have been mentioned above are possible without departing from the inventive concepts set forth herein. The invention, therefore, is not to be limited except in the spirit of the appended claims.

What is claimed is:

1. A process for fabricating an integrated circuit including at least one antifuse and an ESD protection cell for protecting said at least one antifuse from ESD damage during fabrication of said integrated circuit, said process comprising the steps of:

forming a deep valley topology in a region where it is desired to place said ESD protection cell;

forming an ESD protection cell lower electrode over said deep valley topology;

forming a lower electrode for said at least one antifuse away from said deep valley topology;

depositing an interlayer dielectric layer over said ESD protection cell lower electrode and said lower electrode for said at least one antifuse so that a minimum thickness of said interlayer dielectric layer in a region above said ESD protection cell lower electrode is thicker than a minimum thickness of said interlayer dielectric layer in a region above said lower electrode for said at least one antifuse;

opening (i) an ESD protection cell opening having a first areal size and (ii) an antifuse cell opening having substantially said first areal size through said interlayer dielectric layer so as to expose, respectively, (i) said ESD protection cell lower electrode and (ii) said lower electrode of said at least one antifuse; and depositing an antifuse material layer over said interlayer dielectric layer, into said ESD protection cell opening and into said antifuse cell opening so as to overlie said ESD protection cell lower electrode and said lower electrode of said at least one antifuse.

2. A process for fabricating an integrated circuit including at least one antifuse and an ESD protection cell for protecting said at least one antifuse from ESD damage during fabrication of said integrated circuit, said process comprising the steps of:

forming a first interlayer dielectric layer having a first cell opening therein where it is desired to place said ESD protection cell;

forming an ESD protection cell lower electrode in said first cell opening which extends down into said first cell opening;

forming a lower electrode for said at least one antifuse away from said first cell opening;

depositing a second interlayer dielectric layer over said ESD protection cell lower electrode and said lower electrode for said at least one antifuse;

opening (i) an ESD protection cell opening having a first areal size through said second interlayer dielectric layer and below to conform to an upper surface of said ESD protection cell lower electrode and (ii) an antifuse cell opening having substantially said first areal size through said second interlayer dielectric layer so as to expose, respectively, (i) said ESD protection cell lower electrode and (ii) said lower electrode of said at least one antifuse; and depositing an antifuse material layer over said second interlayer dielectric layer, into said ESD protection cell opening and into said antifuse cell opening so as to overlie said ESD protection cell lower electrode and said lower electrode of said at least one antifuse.

* * * * *